United States Patent
Chen et al.

(10) Patent No.: US 10,802,306 B2
(45) Date of Patent: Oct. 13, 2020

(54) VIEWING ANGLE SWITCHABLE DEVICE AND VIEWING ANGLE SWITCHABLE DISPLAY MODULE

(71) Applicant: Coretronic Corporation, Hsin-Chu (TW)

(72) Inventors: Ping-Yeng Chen, Hsin-Chu (TW); Chong-Yang Fang, Hsin-Chu (TW); Yang-Ching Lin, Hsin-Chu (TW); Jen-Wei Yu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 45 days.

(21) Appl. No.: 16/228,777

(22) Filed: Dec. 21, 2018

(65) Prior Publication Data
US 2019/0196236 A1    Jun. 27, 2019

(30) Foreign Application Priority Data

Dec. 26, 2017   (CN) ...................... 2017 2 1843624 U

(51) Int. Cl.
*G02F 1/13* (2006.01)
*G02F 1/1335* (2006.01)
*G02F 1/13363* (2006.01)

(52) U.S. Cl.
CPC ........ *G02F 1/1323* (2013.01); *G02F 1/13363* (2013.01); *G02F 1/133536* (2013.01)

(58) Field of Classification Search
CPC ............. G02F 1/1323; G02F 1/133536; G02F 1/13363
See application file for complete search history.

(56) References Cited

U.S. PATENT DOCUMENTS

| | | | |
|---|---|---|---|
| 4,688,900 | A | 8/1987 | Doane et al. |
| 5,301,046 | A | 4/1994 | Konuma et al. |
| 7,880,843 | B2 | 2/2011 | Morishita et al. |
| 8,982,300 | B2 | 3/2015 | Umemoto |

(Continued)

FOREIGN PATENT DOCUMENTS

| | | |
|---|---|---|
| CN | 1702517 | 11/2005 |
| CN | 1708704 | 12/2005 |

(Continued)

*Primary Examiner* — Thanh Nhan P Nguyen
(74) *Attorney, Agent, or Firm* — JCIPRNET

(57) ABSTRACT

A viewing angle switchable device including an absorptive polarizer, a reflective polarizer and an electrically controlled viewing angle switching element is provided. A transmission axis of the reflective polarizer is parallel to a transmission axis of the absorptive polarizer. The electrically controlled viewing angle switching element is disposed between the absorptive polarizer and the reflective polarizer and includes two transparent substrates, two transparent conductive layers and a liquid crystal layer including a plurality of liquid crystal molecules. When there is a potential difference between the two transparent conductive layers, an orthogonal projection of an optical axis of each of the plurality of liquid crystal molecules on the absorptive polarizer is parallel to or perpendicular to the transmission axis of the absorptive polarizer and the transmission axis of the reflective polarizer. A viewing angle switchable display module including the viewing angle switchable device is also provided.

21 Claims, 10 Drawing Sheets

(56) References Cited

U.S. PATENT DOCUMENTS

| | | |
|---|---|---|
| 2002/0130989 A1 | 9/2002 | Nakao et al. |
| 2003/0193636 A1 | 10/2003 | Allen et al. |
| 2005/0206814 A1 | 9/2005 | Histake |
| 2006/0103782 A1 | 5/2006 | Adachi et al. |
| 2007/0188686 A1 | 8/2007 | Yano et al. |
| 2007/0236939 A1 | 10/2007 | Ouderkirk et al. |
| 2008/0049184 A1 | 2/2008 | Tan et al. |
| 2008/0151147 A1 | 6/2008 | Weber et al. |
| 2009/0015540 A1 | 1/2009 | Suzuki |
| 2009/0174843 A1 | 7/2009 | Sakai et al. |
| 2010/0149459 A1 | 6/2010 | Yabuta et al. |
| 2010/0157195 A1* | 6/2010 | Miyatake ............ G02B 5/3033 349/62 |
| 2010/0265435 A1 | 10/2010 | Hwang et al. |
| 2010/0277786 A1* | 11/2010 | Anderson ............ G02F 1/0136 359/247 |
| 2010/0289989 A1 | 11/2010 | Adachi et al. |
| 2011/0043730 A1 | 2/2011 | Do et al. |
| 2011/0309398 A1 | 12/2011 | Ito et al. |
| 2014/0098330 A1* | 4/2014 | Nam ............ G02B 5/201 349/96 |
| 2014/0232960 A1 | 8/2014 | Schwartz et al. |
| 2015/0208537 A1 | 7/2015 | Cho et al. |
| 2015/0277012 A1 | 10/2015 | Nakamura et al. |
| 2015/0346532 A1 | 12/2015 | Do et al. |
| 2016/0356943 A1 | 12/2016 | Choi et al. |
| 2017/0213874 A1 | 7/2017 | Liu et al. |
| 2017/0219859 A1 | 8/2017 | Christophy et al. |
| 2017/0329073 A1 | 11/2017 | Liu et al. |
| 2017/0343715 A1 | 11/2017 | Fang et al. |
| 2018/0113334 A1 | 4/2018 | Fang et al. |
| 2018/0210243 A1 | 7/2018 | Fang et al. |
| 2018/0335656 A1 | 11/2018 | Chen et al. |

FOREIGN PATENT DOCUMENTS

| | | |
|---|---|---|
| CN | 101473168 | 7/2009 |
| CN | 101661190 | 3/2010 |
| CN | 202141874 | 2/2012 |
| EP | 2051134 | 4/2009 |
| JP | 2008003450 | 1/2008 |
| JP | 2008096458 | 4/2008 |
| JP | 2009522601 | 6/2009 |
| JP | 4369222 | 11/2009 |
| JP | 2011002596 | 1/2011 |
| TW | 200613801 | 5/2006 |
| TW | 200624912 | 7/2006 |
| TW | 200714943 | 4/2007 |
| TW | 200807083 | 2/2008 |
| TW | 200903053 | 1/2009 |
| TW | I309312 | 5/2009 |
| TW | 201031969 | 9/2010 |
| TW | I356937 | 1/2012 |
| TW | 201403577 | 1/2014 |
| TW | 201610512 | 3/2016 |
| TW | M537663 | 3/2017 |
| TW | I612360 | 1/2018 |
| WO | 2016195786 | 12/2016 |

* cited by examiner

VIEWING ANGLE SWITCHABLE DEVICE AND VIEWING ANGLE SWITCHABLE DISPLAY MODULE

CROSS-REFERENCE TO RELATED APPLICATION

This application claims the priority benefit of China application serial no. 201721843624.5, filed on Dec. 26, 2017. The entirety of the above-mentioned patent application is hereby incorporated by reference herein and made a part of this specification.

BACKGROUND OF THE INVENTION

Field of the Invention

The invention relates to an optical device and a display module thereof, and particularly relates to a viewing angle switchable device and a viewing angle switchable display module thereof.

Description of Related Art

Generally, a display device is usually designed to have a wide viewing angle for displaying so as to be viewed by multiple viewers. However, in some situations or on some occasions, for example, when browsing a private website, viewing some confidential information, or entering a password, a user may be subjected to leak some private or confidential information due to the wide viewing angle of a display which may be viewed by others somewhere else. Generally, a light control film (LCF) may be placed in front of a display to filter out wide-angled beams, so as to avoid a peep. The light control film may be also removed manually for displaying with a wide viewing angle. Since it is inconvenient for a user to place or remove a LCF, a viewing angle switchable device where the viewing angle of a display may be adjusted is in need. With the viewing angle switchable device, a user may adjust or select a wide-angle mode or a narrow-angle mode for the display as required by operation.

The information disclosed in this "BACKGROUND OF THE INVENTION" section is only for enhancement of understanding of the background of the described technology and therefore it may contain information that does not form the prior art that is already known to a person of ordinary skill in the art. Further, the information disclosed in the "BACKGROUND OF THE INVENTION" section does not mean that one or more problems to be resolved by one or more embodiments of the invention was acknowledged by a person of ordinary skill in the art.

SUMMARY OF THE INVENTION

The invention provides a viewing angle switchable device, where the viewing angle is controlled in an electric control manner.

The invention also provides a viewing angle switchable display module employing the above-mentioned viewing angle switchable device, which may be switched between a general displaying mode and a peep-avoiding mode by way of applying a voltage.

Other objects and advantages of the invention can be further illustrated by the technical features broadly embodied and described as follows.

In order to achieve one or a portion of or all of the objects or other objects, an embodiment of the invention provides a viewing angle switchable device, including an absorptive polarizer, a reflective polarizer and an electrically controlled viewing angle switching element. The reflective polarizer is disposed at a side of the absorptive polarizer, and a transmission axis of the reflective polarizer is parallel to a transmission axis of the absorptive polarizer. The electrically controlled viewing angle switching element is disposed between the absorptive polarizer and the reflective polarizer and includes two transparent substrates, two transparent conductive layers disposed between the two transparent substrates, and a liquid crystal layer disposed between the two transparent conductive layers. The liquid crystal layer includes a plurality of liquid crystal molecules. When there is a difference in the potentials of the two transparent conductive layers, an orthogonal projection of an optical axis of each of the plurality of liquid crystal molecules on the absorptive polarizer is parallel to or perpendicular to the transmission axis of the absorptive polarizer and the transmission axis of the reflective polarizer.

In order to achieve one or a portion of or all of the objects or other objects, an embodiment of the invention further provides a viewing angle switchable display module, including a display panel and the aforementioned viewing angle switchable device, where the viewing angle switchable device is disposed on a display surface of the display panel.

According to the above description, the embodiments of the invention have at least one of the following advantages or effects. In the viewing angle switchable device of the invention, an inclination direction of the liquid crystal molecules in the viewing angle switchable device is controlled by changing a potential difference between the two transparent conductive layers. A phase delay is caused in an environmental light beam which enters the viewing angle switchable device by a large angle, causing the environmental light beam to be reflected by the reflective polarizer. A phase delay is caused in a display light beam which enters the viewing angle switchable device by a large angle may not pass through the absorptive polarizer (i.e. may be absorbed by the absorptive polarizer). Since the oblique environmental light beam is reflected by the reflective polarizer and the oblique display light beam is absorbed by the absorptive polarizer, a contrast of light leakage at large angle (light leakage of the display light beam) is decreased, so as limit the range of the viewing angle (peep-avoiding). By way of electrical control, a viewing angle switchable display module employing the above-mentioned viewing angle switchable device may be switched between a general displaying mode and a peep-avoiding mode.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. The drawings are not necessarily drawn to scale.

FIG. 6A and FIG. 6B respectively illustrate travelling paths of a display light beam with respect to the X-Z reference plane and the Y-Z reference plane.

FIG. 7A and FIG. 7B respectively illustrate travelling paths of the display light beam with respect to the X-Z reference plane and the Y-Z reference plane.

FIG. 7C illustrates a travelling path of an environmental light beam on the Y-Z reference plane.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
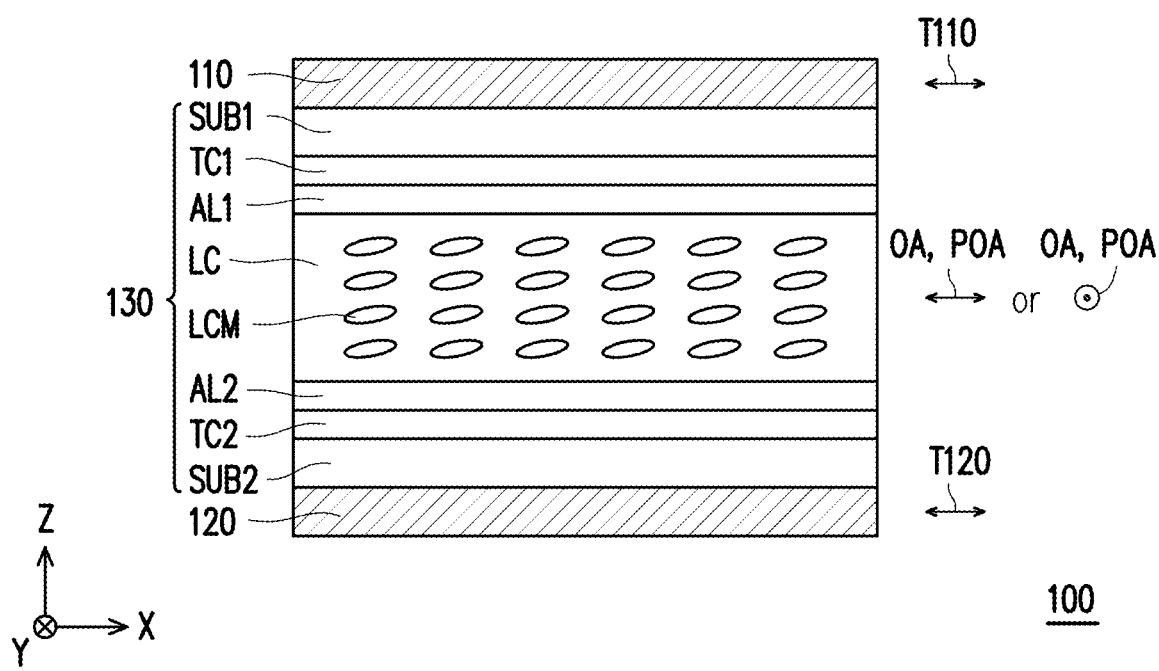
FIG. 1 is a cross-sectional view schematically illustrating a viewing angle switchable device in a general display mode according to a first embodiment of the invention.

FIG. 1 is a cross-sectional view schematically illustrating a viewing angle switchable device in a general display mode according to a first embodiment of the invention. Referring to FIG. 1, a viewing angle switchable device 100 of the first embodiment of the invention includes an absorptive polarizer 110, a reflective polarizer 120 and an electrically controlled viewing angle switching element 130.

The reflective polarizer 120 is disposed at a side of the absorptive polarizer 110, and a transmission axis T120 of the reflective polarizer 120 is parallel to a transmission axis T110 of the absorptive polarizer 110. The electrically controlled viewing angle switching element 130 is disposed between the absorptive polarizer 110 and the reflective polarizer 120, and the electrically controlled viewing angle switching element 130 includes a transparent substrate SUB1, a transparent substrate SUB2, a transparent conductive layer TC1, a transparent conductive layer TC2, and a liquid crystal layer LC.

The transparent substrate SUB1 and the transparent substrate SUB2 are disposed opposite to each other. The transparent conductive layer TC1 and the transparent conductive layer TC2 are disposed between the transparent substrate SUB1 and the transparent substrate SUB2. The liquid crystal layer LC is disposed between the transparent conductive layer TC1 and the transparent conductive layer TC2, and the liquid crystal layer LC includes a plurality of liquid crystal molecules LCM. In the embodiment, the electrically controlled viewing angle switching element 130 may further include an alignment layer AL1 and an alignment layer AL2, where the alignment layer AL1 is disposed between the transparent conductive layer TC1 and the liquid crystal layer LC, and the alignment layer AL2 is disposed between the transparent conductive layer TC2 and the liquid crystal layer LC, so as to orient the liquid crystal molecules LCM.

When there is no potential difference between the transparent conductive layer TC1 and the transparent conductive layer TC2, an optical axis OA of each of the liquid crystal molecules LCM may be substantially parallel to or perpendicular to the absorptive polarizer 110 and the reflective polarizer 120 through the alignment layer AL1 and the alignment layer AL2. In other words, an orthogonal projection POA of the optical axis OA of each of the liquid crystal molecules LCM on the absorptive polarizer 110 is substantially parallel to or perpendicular to the transmission axis T110 of the absorptive polarizer 110 and the transmission axis T120 of the reflective polarizer 120. On the other hand, when there is a potential difference between the transparent conductive layer TC1 and the transparent conductive layer TC2, the liquid crystal molecules LCM are tilted (not shown in FIG. 1) due to the potential difference, and the orthogonal projection POA of the optical axis OA of each of the liquid crystal molecules LCM on the absorptive polarizer 110 is parallel to or perpendicular to the transmission axis T110 of the absorptive polarizer 110 and the transmission axis T120 of the reflective polarizer 120.

Further, as shown in FIG. 1, with the transmission axis T110 of the absorptive polarizer 110 and the transmission axis T120 of the reflective polarizer 120 both extending in a first direction X, the alignment layer AL1 and the alignment layer AL2 may be both oriented in a horizontal alignment in parallel to the first direction X (or a second direction Y), such that when there is no potential difference between the transparent conductive layer TC1 and the transparent conductive layer TC2, the optical axis OA of each of the liquid crystal molecules LCM substantially extends along the first direction X (or the second direction Y). Alternatively, the alignment layer AL1 and the alignment layer AL2 may be both oriented in a vertical alignment, i.e. when there is no potential difference between the transparent conductive layer TC1 and the transparent conductive layer TC2, the optical axis OA of each of the liquid crystal molecules LCM substantially extends along a direction Z of the thickness of the viewing angle switchable device 100 (not shown in FIG. 1). Regardless of the horizontal alignment or the vertical alignment, when there is a potential difference between the transparent conductive layer TC1 and the transparent conductive layer TC2, the liquid crystal molecules LCM are tilted due to the potential difference, such that the optical axis OA of each of the liquid crystal molecules LCM is inclined (not shown in FIG. 1) relative to the transmission axis T110 of the absorptive polarizer 110 and the transmission axis T120 of the reflective polarizer 120, i.e. an angle ranging from 0 to 90 is formed between the optical axis OA of each of the liquid crystal molecules LCM and the transmission axis T110 of the absorptive polarizer 110 (or between the optical axis OA of each of the liquid crystal molecules LCM and the transmission axis T120 of the reflective polarizer 120). Moreover, when there is a potential difference between the transparent conductive layer TC1 and the transparent conductive layer TC2, the orthogonal projection POA of the optical axis OA of each of the liquid crystal molecules LCM on the absorptive polarizer 110 (or on the reflective polarizer 120) is parallel to or perpendicular to the transmission axis T110 of the absorptive polarizer 110 and the transmission axis T120 of the reflective polarizer 120. To be specific, the orthogonal projection POA of the optical axis OA of each of the liquid crystal molecules LCM on the absorptive polarizer 110 (or on the reflective polarizer 120) extends along the first direction X or the second direction Y.

By changing the potential difference between the transparent conductive layer TC1 and the transparent conductive layer TC2, an inclination direction of the liquid crystal molecules LCM is controlled. As such, a phase delay is caused in a light beam which enters the viewing angle switchable device 100 by a large angle along the second direction Y, such that the light beam cannot pass through the absorptive polarizer 110. As a result, the range of the viewing angle is narrowed (peep-avoiding). As for a viewing angle switchable display module employing the viewing angle switchable device 100, it may be switched between a general display mode and a peep-avoiding mode in an electric control manner (as described in further detail from FIG. 6A to FIG. 7D). Besides the peep-avoiding, with the configuration of the reflective polarizer 120, an environmental light beam which enters the viewing angle switchable device 100 by a large angle is reflected by the reflective polarizer 120, so as to enhance the reflection of the environmental light beam by the viewing angle switchable device 100. As such, a contrast of large angle light leakage of the viewing angle switchable device 100 is decreased so as to help avoid a peep from a large angle.

Other implementations of the viewing angle switchable device are described below with reference of FIG. 2 to FIG. 5, where the same components are denoted by the same referential numbers, and details thereof are not repeated. FIG. 2, FIG. 3, FIG. 4A and FIG. 5 are respectively cross-sectional views schematically illustrating viewing angle switchable devices in the general display mode according to a second embodiment to a fifth embodiment of the invention. FIG. 4B is a top view schematically illustrating a reflective polarizer in FIG. 4A.

Figure 2:
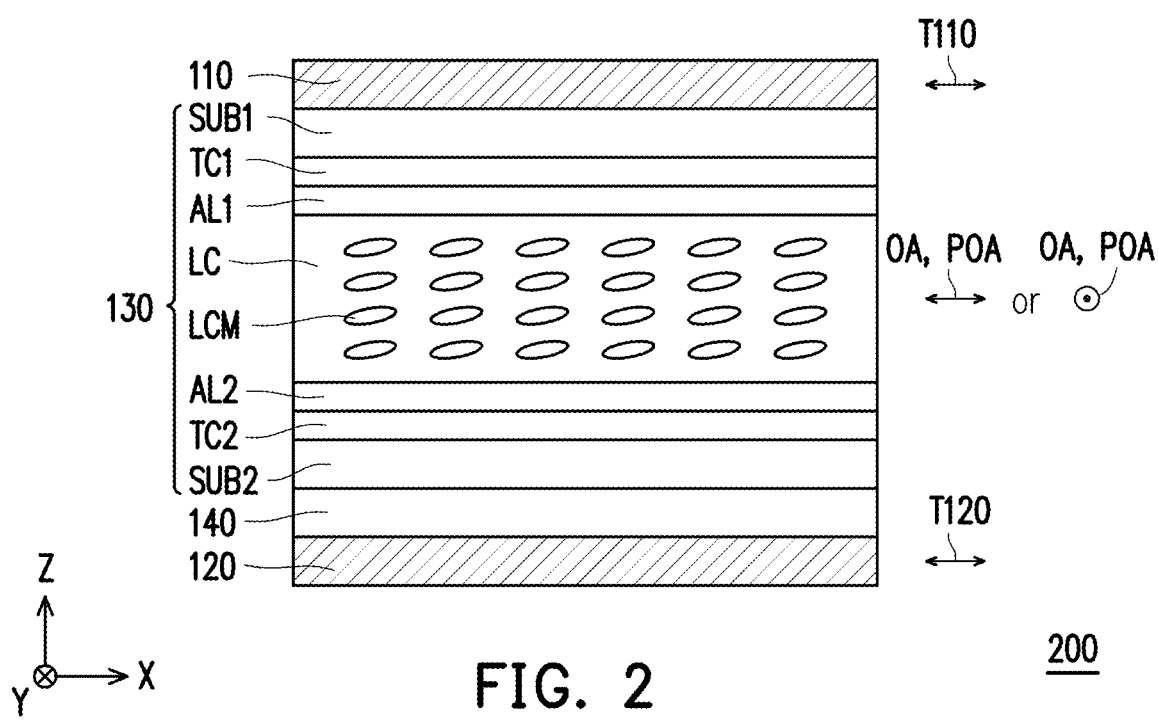
FIG. 2, FIG. 3, FIG. 4A and FIG. 5 are respectively cross-sectional views schematically illustrating viewing angle switchable devices in the general display mode according to a second embodiment to a fifth embodiment of the invention.

Referring to FIG. 2, main differences between the viewing angle switchable device 200 of the second embodiment of the invention and the viewing angle switchable device 100 of FIG. 1 are as follows. The viewing angle switchable device 200 further includes a compensation film 140. The compensation film 140 is disposed between the absorptive polarizer 110 and the reflective polarizer 120 and is overlapped with the electrically controlled viewing angle switching element 130. As shown in FIG. 2, the compensation film 140 may be located between the electrically controlled viewing angle switching element 130 and the reflective polarizer 120, though the invention is not limited thereto. In another embodiment, the compensation film 140 may be located between the electrically controlled viewing angle switching element 130 and the absorptive polarizer 110.

The compensation film 140 may be an A-type plate, an O-type plate, a C-type plate, or a composite plate constructed by at least two of the above three types of plates. Each of the A-type plate, the O-type plate and the C-type plate may be made of liquid crystal polymers. As for the A-type plate, optical axes of the liquid crystal polymers are parallel to a film surface of the A-type plate. As for the O-type plate, optical axes of the liquid crystal polymers are inclined relative to a film surface of the O-type plate. As for the C-type plate, optical axes of the liquid crystal polymers are perpendicular to a film surface of the C-type plate.

By configuring the compensation film 140, the large angle light leakage of the viewing angle switchable device 200 in the second direction Y is mitigated. Besides, the large angle light leakage in an azimuth 0±45 degrees and an azimuth 180±45 degrees is decreased, and reflection of the environmental light beam in the azimuth 0±45 degrees and the azimuth 180±45 degrees is increased, so as to decrease the contrast of the oblique viewing angle. As such, peep from a large angle is avoided. As for a viewing angle switchable display module employing the viewing angle switchable device 200, in the general display mode, the viewing angle of a display image is not limited by the electrically controlled viewing angle switching element 130 and the compensation film 140 disposed between the absorptive polarizer 110 and the reflective polarizer 120. On the other hand, in the peep-avoiding mode, a phase delay is caused in the light beam entering the viewing angle switchable device 200 by a large angle and passing through the electrically controlled viewing angle switching element 130 via the electric control manner, and the large angle light leakage of the azimuth 0±45 degrees and the azimuth 180±45 degrees is decreased by using the compensation film 140. As such, a peep from a large angle is effectively avoided. Moreover, in the embodiment, the reflection of the environmental light beam is enhanced by using the reflective polarizer 120, thus the contrast of the large angle light leakage is decreased and a peep from a large angle is effectively avoided.

Figure 3:
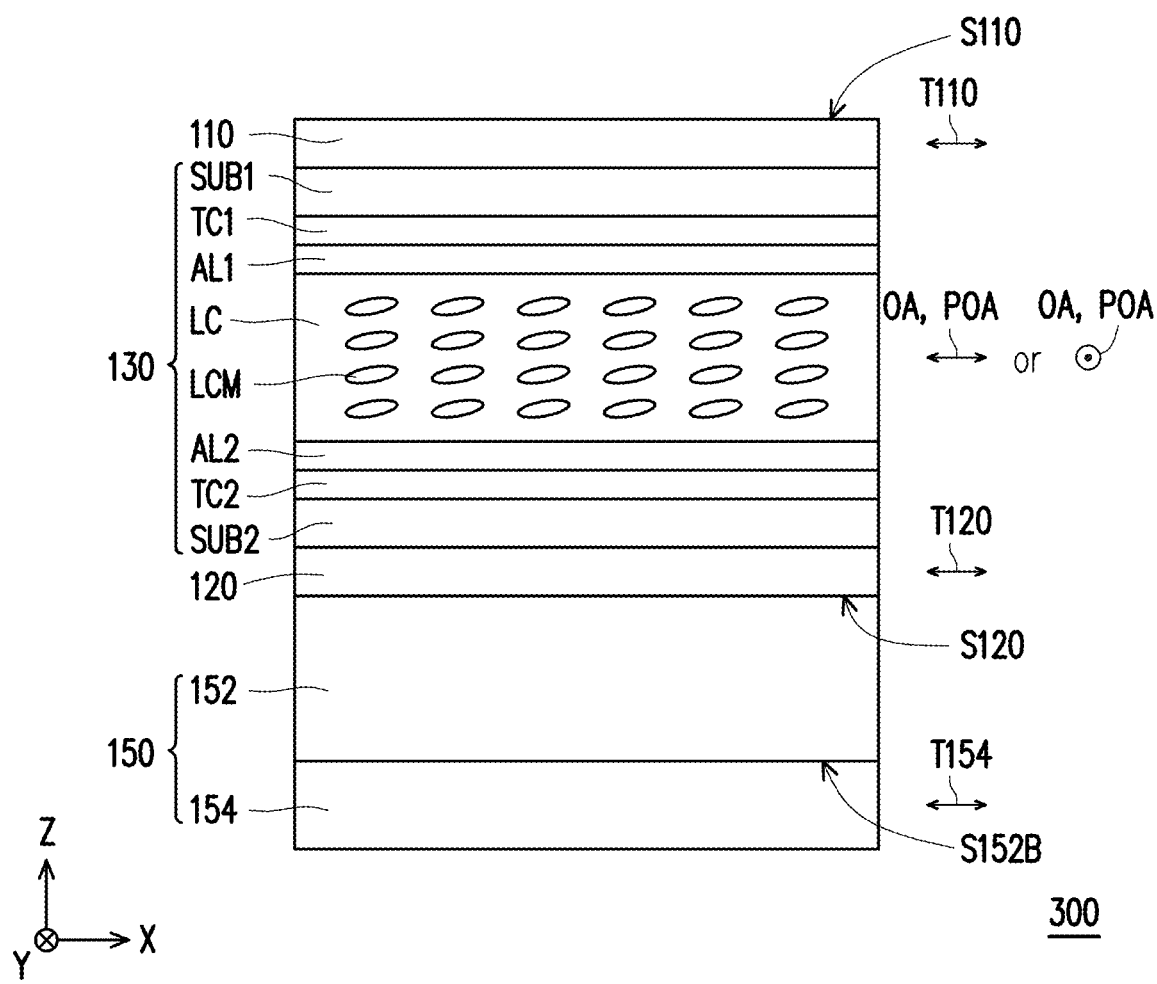

Referring to FIG. 3, main differences between the viewing angle switchable device 300 of the third embodiment of the invention and the viewing angle switchable device 100 of FIG. 1 are as follows. The viewing angle switchable device 300 further includes a compensation element 150. The compensation element 150 includes a compensation film 152 and an absorptive polarizer 154. The compensation film 152 of the compensation element 150 may be an A-type plate, an O-type plate, a C-type plate or a composite plate constructed by at least two of the above three types of plates. Moreover, a transmission axis T154 of the absorptive polarizer 154 of the compensation element 150 is parallel to the transmission axis T110 of the absorptive polarizer 110 and the transmission axis T120 of the reflective polarizer 120.

The compensation element 150 may be disposed adjacent to the absorptive polarizer 110 or adjacent to the reflective polarizer 120, and the compensation film 152 of the compensation element 150 is disposed between the absorptive polarizer 154 of the compensation element 150 and an adjacent polarizer (the absorptive polarizer 110 or the reflective polarizer 120). In the embodiment, the compensation element 150 is disposed on a surface S120 of the reflective polarizer 120 away from the electrically controlled viewing angle switching element 130, and the compensation film 152 of the compensation element 150 is disposed between the absorptive polarizer 154 of the compensation element 150 and the reflective polarizer 120. For example, the absorptive polarizer 154 of the compensation element 150 is disposed on a surface of the compensation film 152 of the compensation element 150 away from the electrically controlled viewing angle switching element 130 (for example, a lower surface S152B of the compensation film 152), though the invention is not limited thereto. In another embodiment, the compensation element 150 may be disposed on a surface S110 of the absorptive polarizer 110 away from the electrically controlled viewing angle switching element 130, and the compensation film 152 of the compensation element 150 is disposed between the absorptive polarizer 154 of the compensation element 150 and the absorptive polarizer 110. For example, the absorptive polarizer 154 of the compensation element 150 is disposed on a surface of the compensation film 152 of the compensation element 150 away from the electrically controlled viewing angle switching element 130.

By configuring the compensation element 150, the large angle light leakage of the viewing angle switchable device 300 in the second direction Y is mitigated. Besides, the large angle light leakage of the azimuth 0±45 degrees and the azimuth 180±45 degrees is also decreased, such that a better peep-avoiding effect is achieved. As for a viewing angle switchable display module employing the viewing angle switchable device 300, in the peep-avoiding mode, a phase delay is caused in the light beam entering the viewing angle switchable device 300 by a large angle and passing through the electrically controlled viewing angle switching element 130 via the electric control manner, and the large angle light leakage of the azimuth 0±45 degrees and the azimuth 180±45 degrees is decreased by using the compensation component 150. As such, a peep from a large angle is effectively avoided.

In an embodiment, the viewing angle switchable device 300 may further include the compensation film 140 of FIG. 2.

Figure 4A:
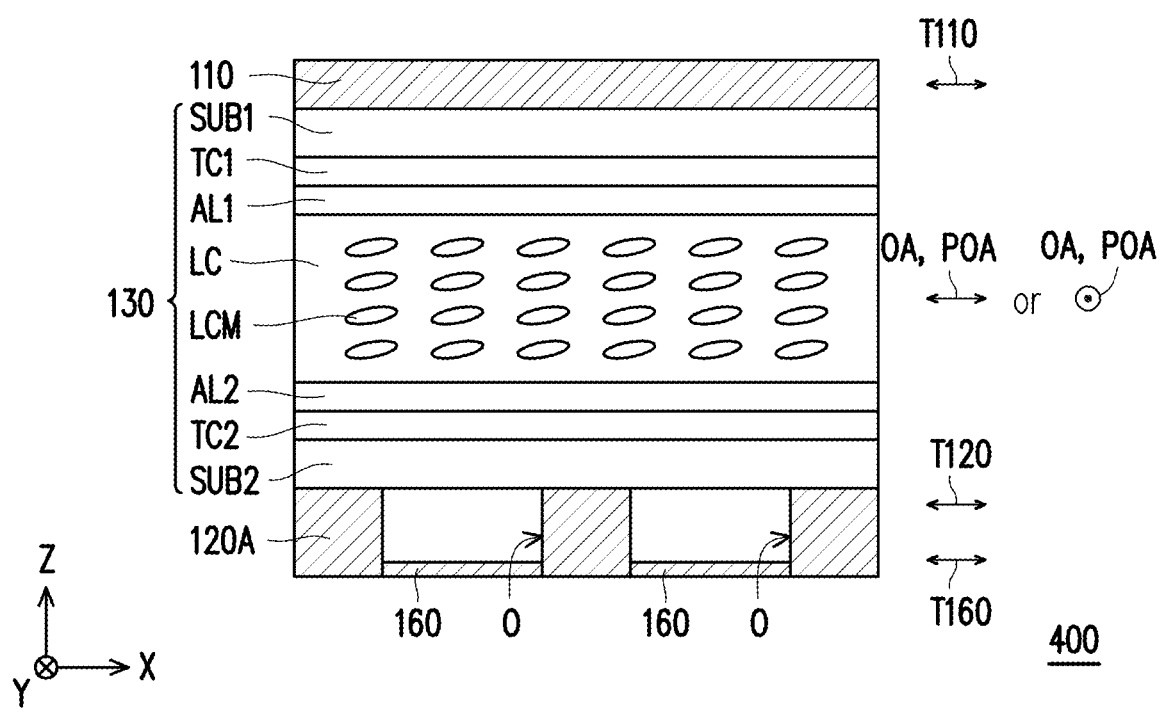
Figure 4B:
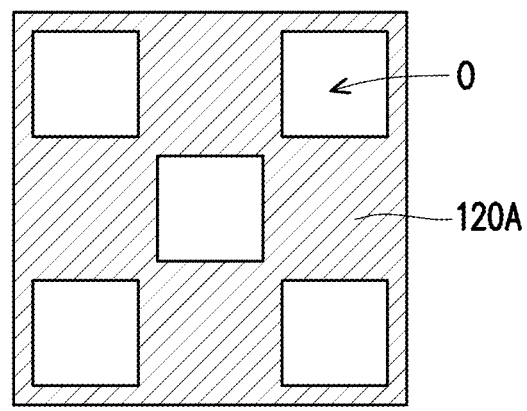
FIG. 4B is a top view schematically illustrating a reflective polarizer in FIG. 4A.

Referring to FIG. 4A and FIG. 4B, main differences between the viewing angle switchable device 400 of the fourth embodiment of the invention and the viewing angle switchable device 100 of FIG. 1 are as follows. In the viewing angle switchable device 400, the reflective polarizer 120A has at least one opening O. In FIG. 4B, the reflective polarizer 120A has 5 openings O, and each of the openings O is a quadrilateral opening. However, the number and the shape of the openings O and the distribution of the openings O in the reflective polarizer 120A may be changed as required, which are not limited to the embodiments shown in FIG. 4A and FIG. 4B. Moreover, each of the openings O may be configured with another absorptive polarizer (for example, an absorptive polarizer 160), and a transmission axis T160 of the absorptive polarizer 160 is parallel to the transmission axis T110 of the absorptive polarizer 110 and the transmission axis T120 of the reflective polarizer 120.

The reflective polarizer 120A has a predetermined pattern through the openings O of the reflective polarizer 120A. Since the predetermined pattern is reflected when an environmental light beam enters the viewing angle switchable device 300 by a large angle, the large angle light leakage is interfered. As such, the openings O of the reflective polarizer 120A are favourable in peep-avoiding.

In an embodiment, the viewing angle switchable device 400 may further include the compensation film 140 of FIG. 2, the compensation element 150 of FIG. 3, or a combination of the compensation film 140 of FIG. 2 and the compensation element 150 of FIG. 3.

Figure 5:
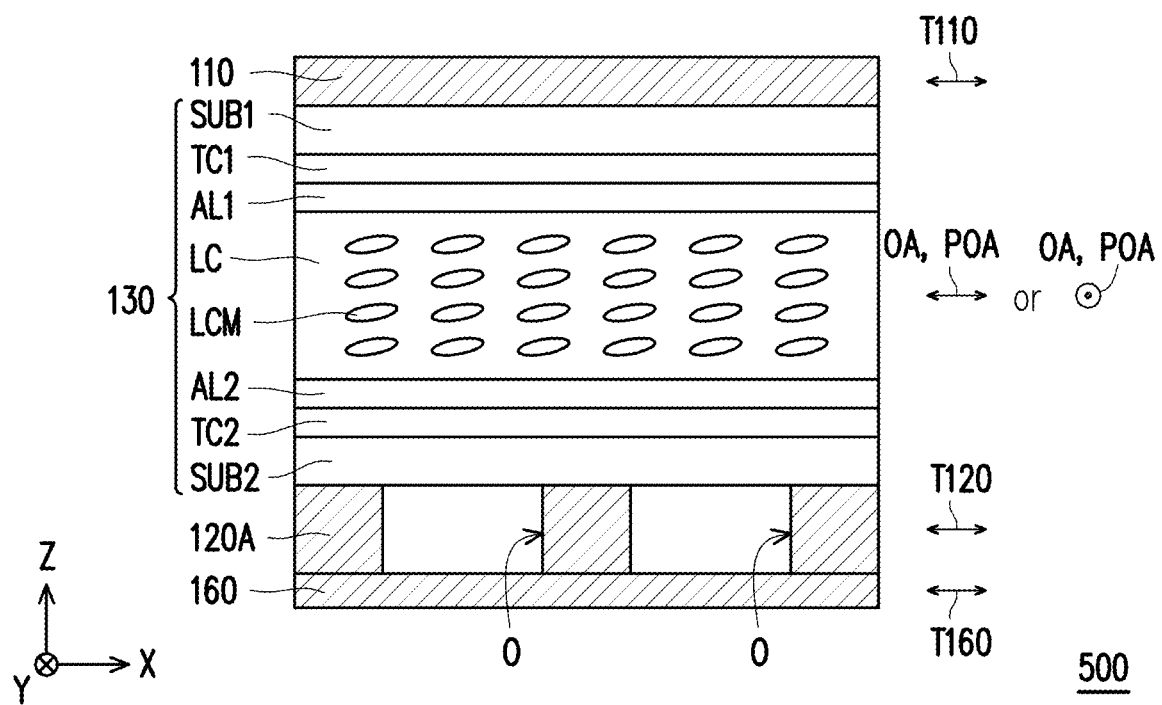

Referring to FIG. 5, main differences between the viewing angle switchable device 500 of the fifth embodiment of the invention and the viewing angle switchable device 400 of FIG. 4A are as follows. In the viewing angle switchable device 400, each opening O is configured with one absorptive polarizer 160. Namely, the number of the absorptive polarizers 160 and the number of the openings O are identical. In the viewing angle switchable device 500, the reflective polarizer 120A is disposed between the absorptive polarizer 160 and the electrically controlled viewing angle switching element 130, and the number of the absorptive polarizer 160 is one. Moreover, the absorptive polarizer 160 covers all of the openings O.

In an embodiment, the viewing angle switchable device 500 may further include the compensation film 140 of FIG. 2, the compensation element 150 of FIG. 3, or a combination of the compensation film 140 of FIG. 2 and the compensation element 150 of FIG. 3.

Figure 6A:
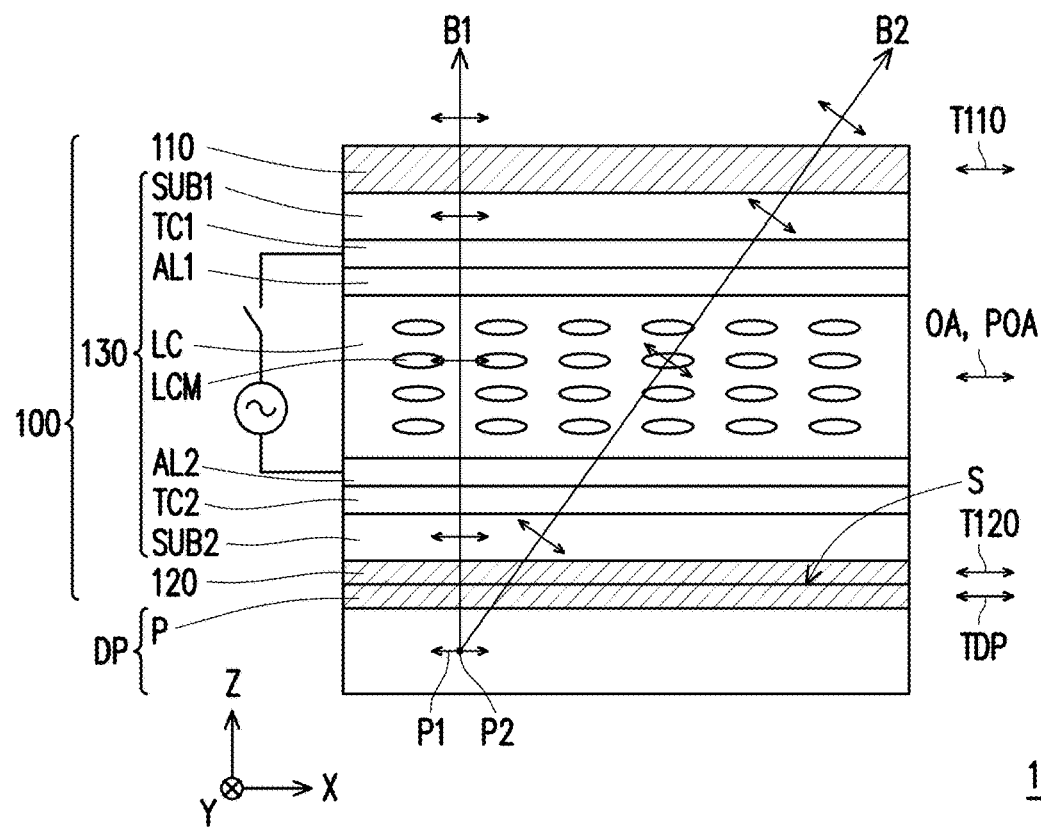
FIG. 6A and FIG. 6B are cross-sectional views respectively in an X-Z reference plane and a Y-Z reference plane schematically illustrating a viewing angle switchable display module in the general display mode according to a first embodiment of the invention.
Figure 6B:
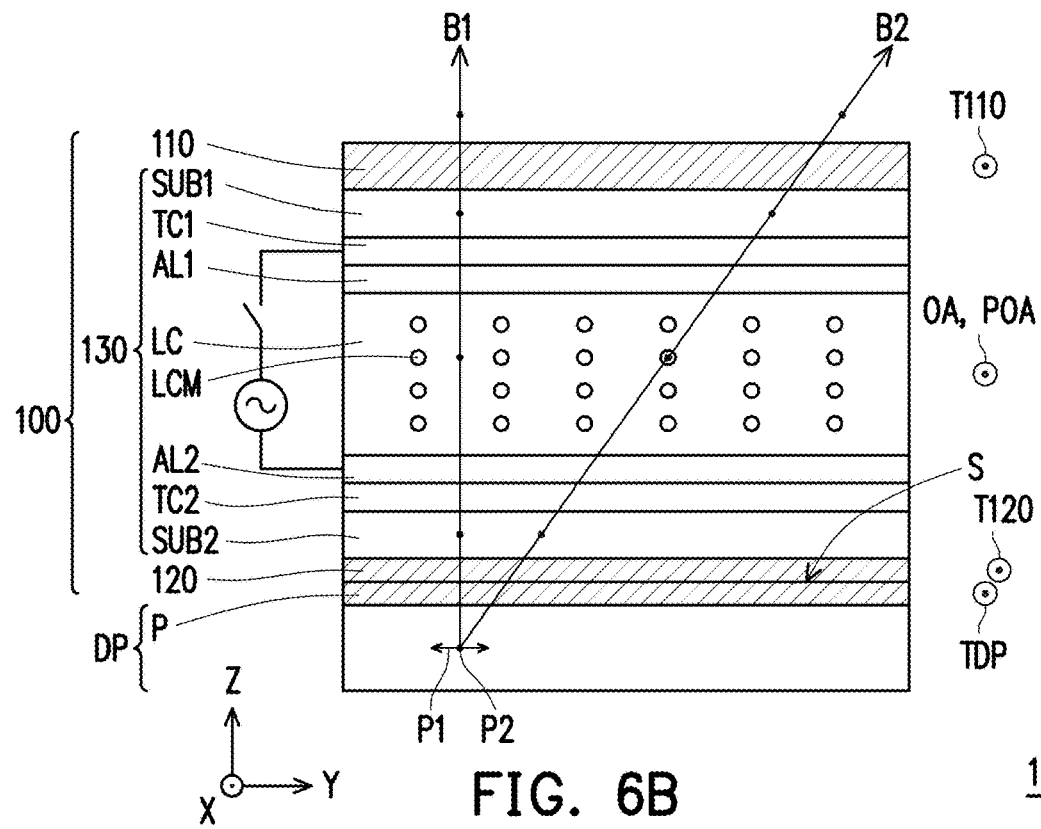
Figure 6C:
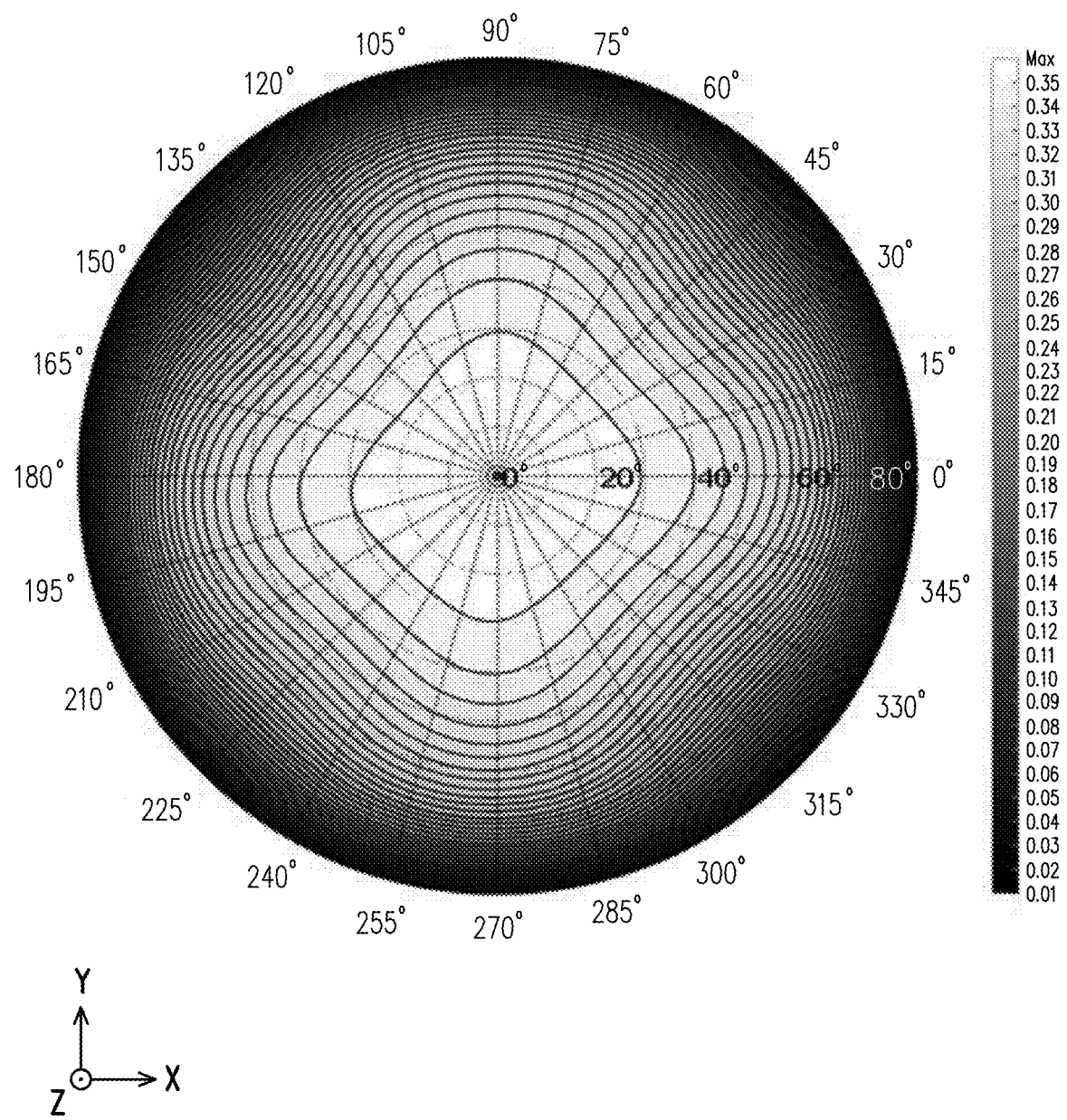
FIG. 6C is a schematic diagram of angle distribution, which represents transmittances at different viewing angles of the viewing angle switchable display module in the general display mode of the first embodiment.
Figure 7A:
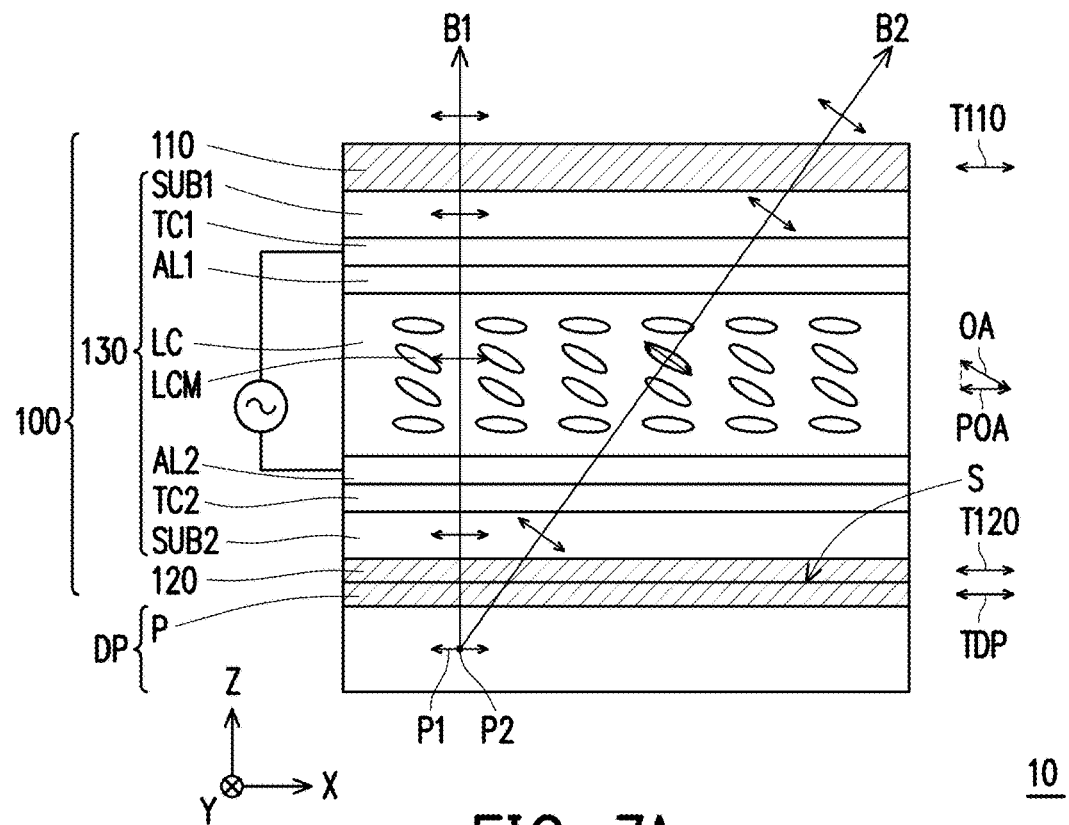
FIG. 7A and FIG. 7B are cross-sectional views respectively in the X-Z reference plane and the Y-Z reference plane schematically illustrating a viewing angle switchable display module in an peep-avoiding mode in according to the first embodiment of the invention.
Figure 7B:
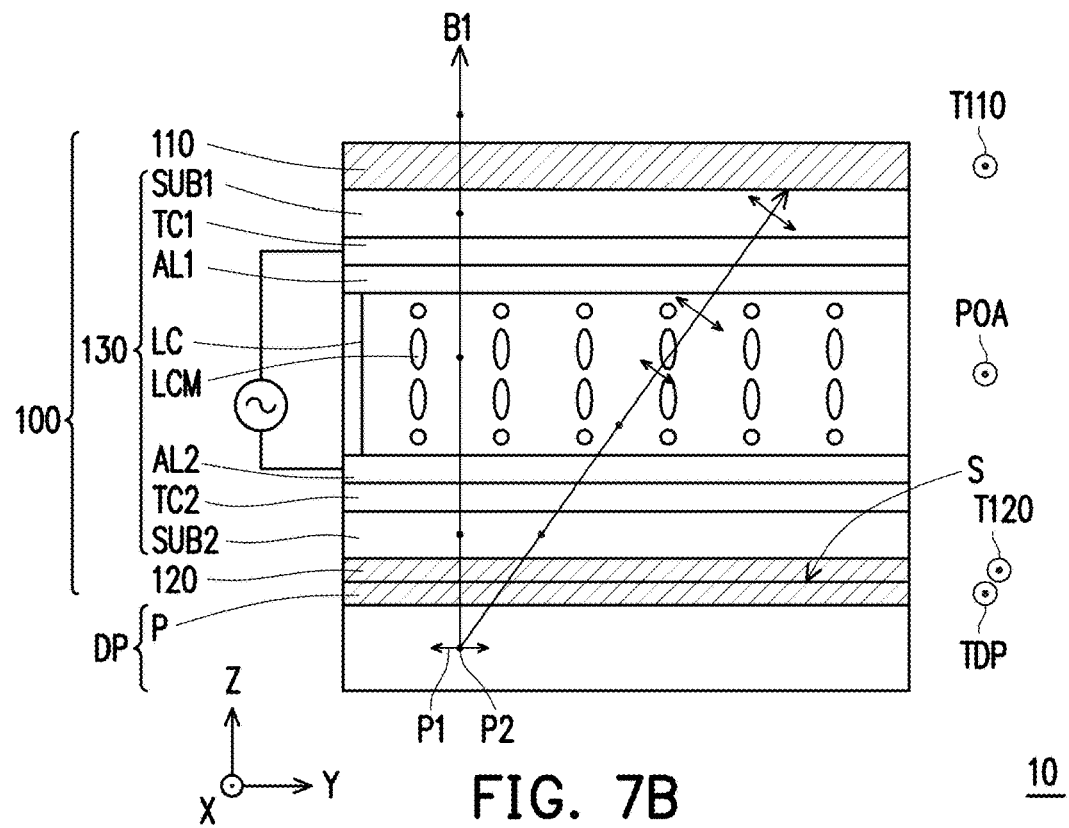
Figure 7C:
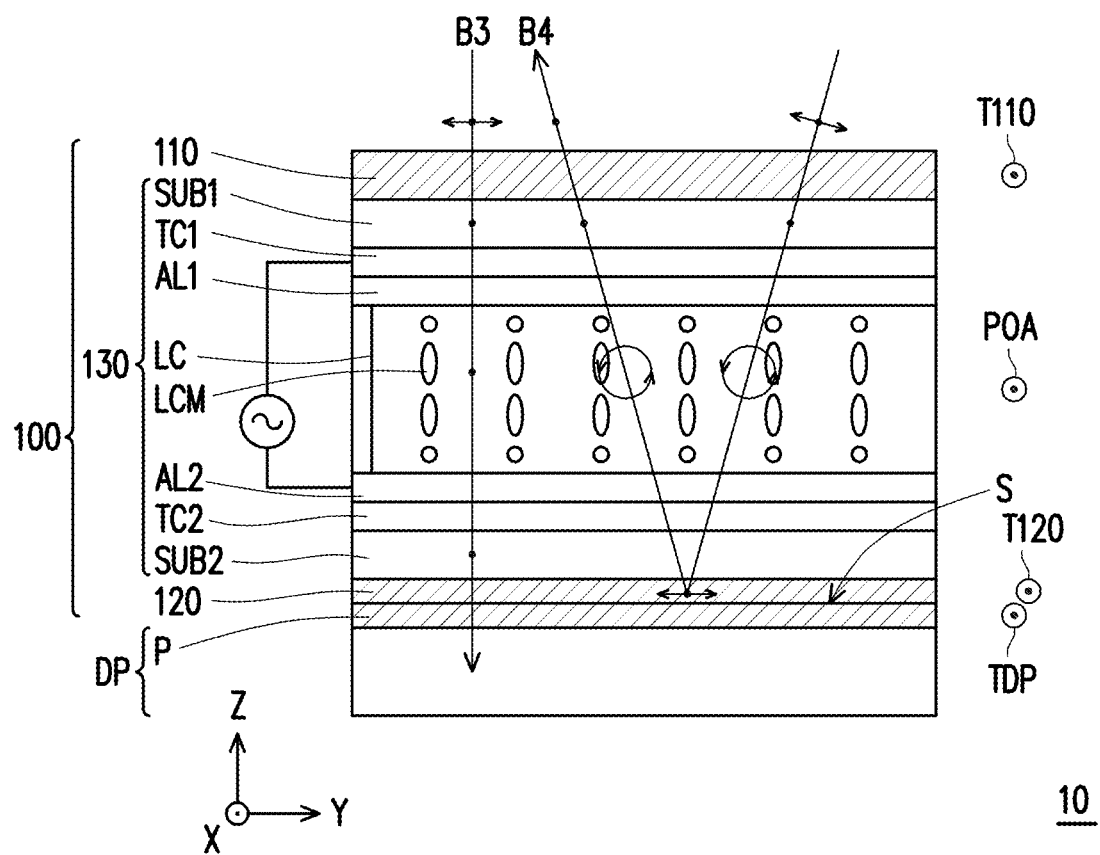
FIG. 7C is a cross-sectional view of a viewing angle switchable display module in the peep-avoiding mode in the Y-Z reference plane according to the first embodiment of the invention.
Figure 7D:
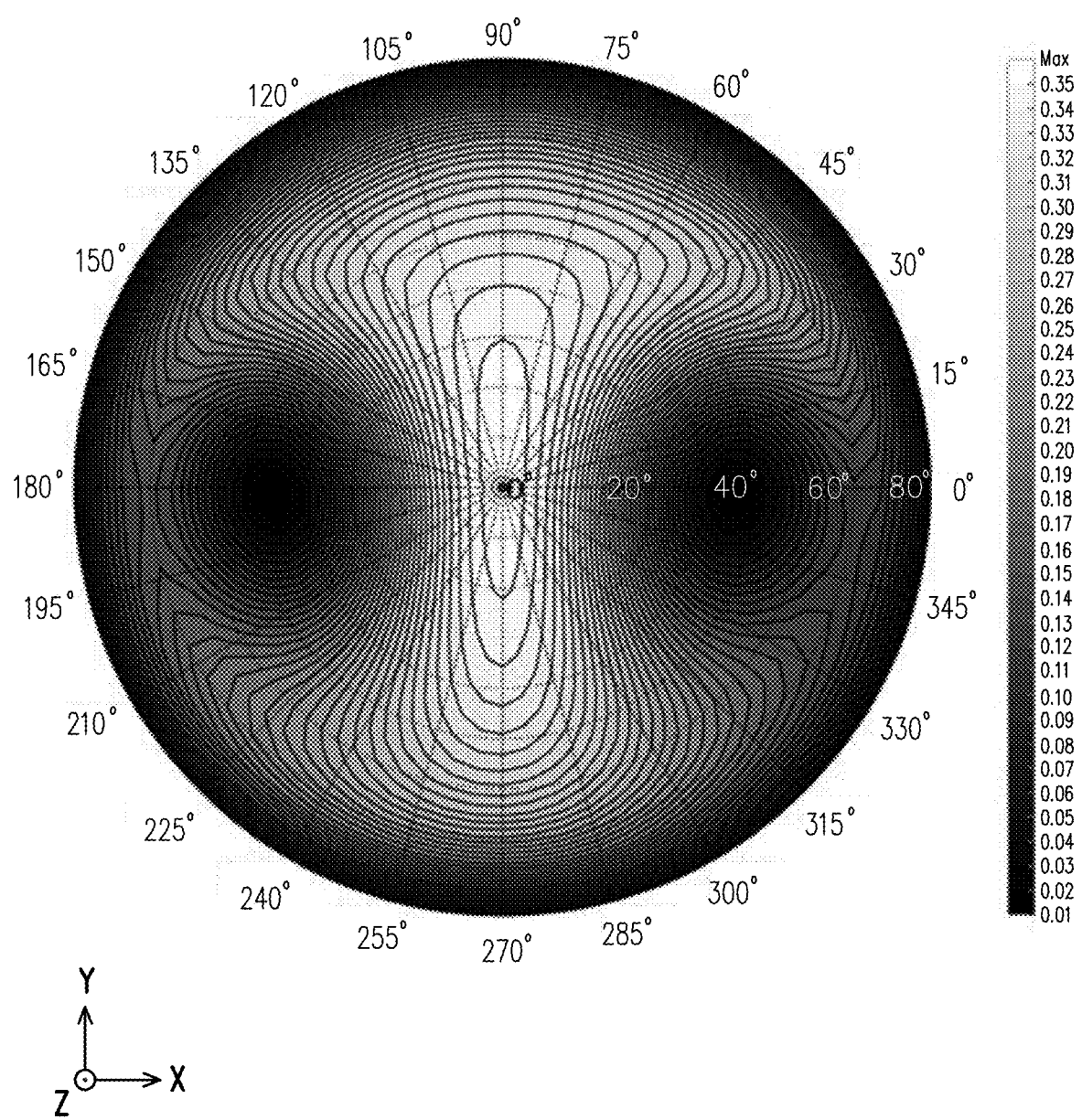
FIG. 7D is a schematic diagram of angle distribution, which represents transmittances at different viewing angles of the viewing angle switchable display module in the peep-avoiding mode of the first embodiment.

The general display mode and the peep-avoiding mode of a viewing angle switchable display module employing the viewing angle switchable devices of the invention are described below with reference of FIG. 6A to FIG. 7D. FIG. 6A and FIG. 6B are cross-sectional views respectively in an X-Z reference plane and a Y-Z reference plane schematically illustrating a viewing angle switchable display module in the general display mode according to a first embodiment of the invention. FIG. 6A and FIG. 6B respectively illustrate travelling paths of a display light beam with respect to the X-Z reference plane and the Y-Z reference plane. FIG. 6C is a schematic diagram of angle distribution, which represents transmittances at different viewing angles of the viewing angle switchable display module in the general display mode of the first embodiment. FIG. 7A and FIG. 7B are cross-sectional views respectively in the X-Z reference plane and the Y-Z reference plane schematically illustrating a viewing angle switchable display module in an peep-avoiding mode in according to the first embodiment of the invention. FIG. 7A and FIG. 7B respectively illustrate travelling paths of the display light beam with respect to the X-Z reference plane and the Y-Z reference plane. FIG. 7C is a cross-sectional view of a viewing angle switchable display module in the peep-avoiding mode in the Y-Z reference plane according to the first embodiment of the invention, and FIG. 7C illustrates a travelling path of an environmental light beam on the Y-Z reference plane. FIG. 7D is a schematic diagram of angle distribution, which represents transmittances at different viewing angles of the viewing angle switchable display module in the peep-avoiding mode of the first embodiment.

Referring to FIG. 6A and FIG. 6B, a viewing angle switchable display module 10 of the first embodiment of the invention includes a display panel DP and a viewing angle switchable device (for example, the viewing angle switchable device 100 of FIG. 1).

The display panel DP may be any type of display panel, for example, a self-luminous display panel or a non-self-luminous display panel. The self-luminous display panel is, for example, an organic light-emitting display panel. On the other hand, the non-self-luminous display panel is, for example, a liquid crystal display panel, though the invention is not limited thereto. When the display panel DP is the non-self-luminous display panel, the display module 10 may further include a backlight module (not shown). The backlight module may be a direct type backlight module or a side incident type backlight module.

The display module DP may have at least one polarizer (for example, an absorptive polarizer). Further, the display panel DP may at least have a polarizer P located at a light emitting side of the display panel DP, so as to output light beams with a specific polarization direction. Moreover, a transmission axis TDP of the polarizer P is parallel to the transmission axis T120 of the reflective polarizer 120, such that the light beam passing through the polarizer P may further pass through the reflective polarizer 120. In the embodiment, the transmission axis TDP of the polarizer P is parallel to the first direction X and an opposite direction of the first direction X, so that the polarizer P allows the display light beam with a polarization direction (for example, a first polarization direction P1) parallel to the first direction X and the opposite direction of the first direction X to pass through, and blocks the display light beam with a polarization direction (for example, a second polarization direction P2) parallel to the second direction Y and an opposite direction of the second direction Y. In another embodiment, the display panel DP may further has another polarizer (not shown), and the another polarizer is located at a light incident side of the display panel DP, where a transmission axis of the polarizer located at the light incident side of the display panel DP may be parallel to or perpendicular to the transmission axis TDP of the polarizer P.

The viewing angle switchable device 100 is disposed on a display surface S (for example, a light emitting surface of the polarizer P) of the display panel DP and is switched between the general display mode and the peep-avoiding mode in an electric control manner, which is described in detail below.

Referring to FIG. 6A to FIG. 6C, when there is no potential difference between the transparent conductive layer TC1 and the transparent conductive layer TC2, a polarization direction of the display light beam entering the viewing angle switchable device 100 from the reflective polarizer 120 is parallel to an orthogonal projection of the optical axis OA of each of the liquid crystal molecules LCM on a polarization plane (a plane perpendicular to a travelling path of the display light beam). As such, transmittances of the display light beams at various incident angles (including a display light beam B1 vertically entering the viewing angle switchable device 100 and a display light beam B2 entering the viewing angle switchable device 100 by a large angle) is not influenced. Moreover, since a reflectivity of the display panel DP is very low, when the environmental light beam is incident to the viewing angle switchable device 100, both the environmental light beam vertically entering the viewing angle switchable device 100 and the environmental light beam entering the viewing angle switchable device 100 by a large angle are absorbed by the display panel DP. As a result, in a general display mode, the display image is prevented from be interfering by the environmental light beam.

Referring to FIG. 7A to FIG. 7D, when there is a potential difference between the transparent conductive layer TC1 and the transparent conductive layer TC2, the optical axis OA of each of the liquid crystal molecules LCM is tilted due to an electric field. In FIG. 7A to FIG. 7D, the orthogonal projection POA of the optical axis OA of each of the liquid crystal molecules LCM on the absorptive polarizer 110 extends in the first direction X, i.e. when there is a potential difference between the transparent conductive layer TC1 and the transparent conductive layer TC2, the orthogonal projection POA of the optical axis OA of each of the liquid crystal molecules LCM on the absorptive polarizer 110 is parallel to the transmission axis T110 of the absorptive polarizer 110 and the transmission axis T120 of the reflective polarizer 120, though the invention is not limited thereto. In another embodiment, the orthogonal projection POA of the optical axis OA of each of the liquid crystal molecules LCM on the absorptive polarizer 110 may extend in a second direction Y, i.e. when there is a potential difference between the transparent conductive layer TC1 and the transparent conductive layer TC2, the orthogonal projection POA of the optical axis OA of each of the liquid crystal molecules LCM on the absorptive polarizer 110 may be perpendicular to the transmission axis T110 of the absorptive polarizer 110 and the transmission axis T120 of the reflective polarizer 120.

Referring to FIG. 7A, as for the display light beam on the X-Z reference plane, a polarization direction of the display light beam is also parallel to the orthogonal projection of the optical axis OA of each of the liquid crystal molecules LCM on the polarization plane, so that transmittances of the display light beams at various incident angles (including the display light beam B1 vertically entering the viewing angle switchable device 100 and the display light beam B2 entering the viewing angle switchable device 100 by a large angle) is not influenced. Referring to FIG. 7B, as for the display light beam on the Y-Z reference plane, a polarization direction of the display light beam B1 vertically entering the viewing angle switchable device 100 is also parallel to the orthogonal projection of the optical axis OA of each of the liquid crystal molecules LCM on the polarization plane, so that the transmittances of the display light beam B1 vertically entering the viewing angle switchable device 100 is not influenced. However, the polarization direction of the display light beam B2 incident to the viewing angle switchable device 100 by a large angle and the orthogonal projection of the optical axis OA of each of the liquid crystal molecules LCM on the polarization plane form an angle therebetween, such that the polarization direction of the display light beam B2 is changed. The larger the angle is, the less of display light beam B2 passing through the absorptive polarizer 110 (i.e. the transmittance is lower). As a result, a peep is avoiding by narrowing the range of the viewing angle from the second direction Y and the opposite direction of the second direction Y.

Referring to FIG. 7C, it should be noted that, as for the environmental light beam on the Y-Z reference plane, a polarization direction of the environmental light beam B3 vertically entering the viewing angle switchable device 100 is parallel to the orthogonal projection of the optical axis OA of each of the liquid crystal molecules LCM on the polarization plane, so that in the peep-avoiding mode, the environmental light beam B3 vertically entering the viewing angle switchable device 100 is absorbed by the display panel DP without the display image from a front view. On the other hand, a polarization direction of an environmental light beam B4 incident to the viewing angle switchable device 100 by a large angle and the orthogonal projection of the optical axis OA of each of the liquid crystal molecules LCM on the polarization plane form an angle therebetween, such that the polarization direction of the environmental light beam B4 is changed. Subsequently, a part of the environmental light beam B4 is reflected by the reflective polarizer 120. The environmental light beam B4 reflected by the reflective polarizer 120 may again pass through the liquid crystal layer LC to change the polarization direction of the environmental light beam B4. Then, the environmental light beam B4 may pass through the absorptive polarizer 160. Since the environmental light beam B4 is reflected by the reflective polarizer 120 and then passes through the absorptive polarizer 160, reflection of the environmental light beam by the viewing angle switchable device 100 is enhanced. By enhancing the reflection of the environmental light beam, the contrast of the large angle light leakage is decreased, and thus a peep is further avoided.

In another embodiment, the viewing angle switchable device 100 of the viewing angle switchable display module 10 may be replaced by the viewing angle switchable device 200 of FIG. 2, the viewing angle switchable device 300 of FIG. 3, the viewing angle switchable device 400 of FIG. 4A, or the viewing angle switchable device 500 of FIG. 5. In still another embodiment, the viewing angle switchable display module 10 may adopt the viewing angle switchable device 100 of FIG. 1 (or the viewing angle switchable device 200 of FIG. 2, the viewing angle switchable device 400 of FIG. 4A, or the viewing angle switchable device 500 of FIG. 5), and the viewing angle switchable display module 10 may further include the compensation element 150 of FIG. 3, where the compensation element 150, the display panel DP and the viewing angle switchable device 100 are overlapped with each other. For example, the compensation element 150 and the viewing angle switchable device 100 may be sequentially disposed on the display panel DP, or positions of the compensation element 150 and the viewing angle switchable device 100 may be exchanged.

Figure 8:
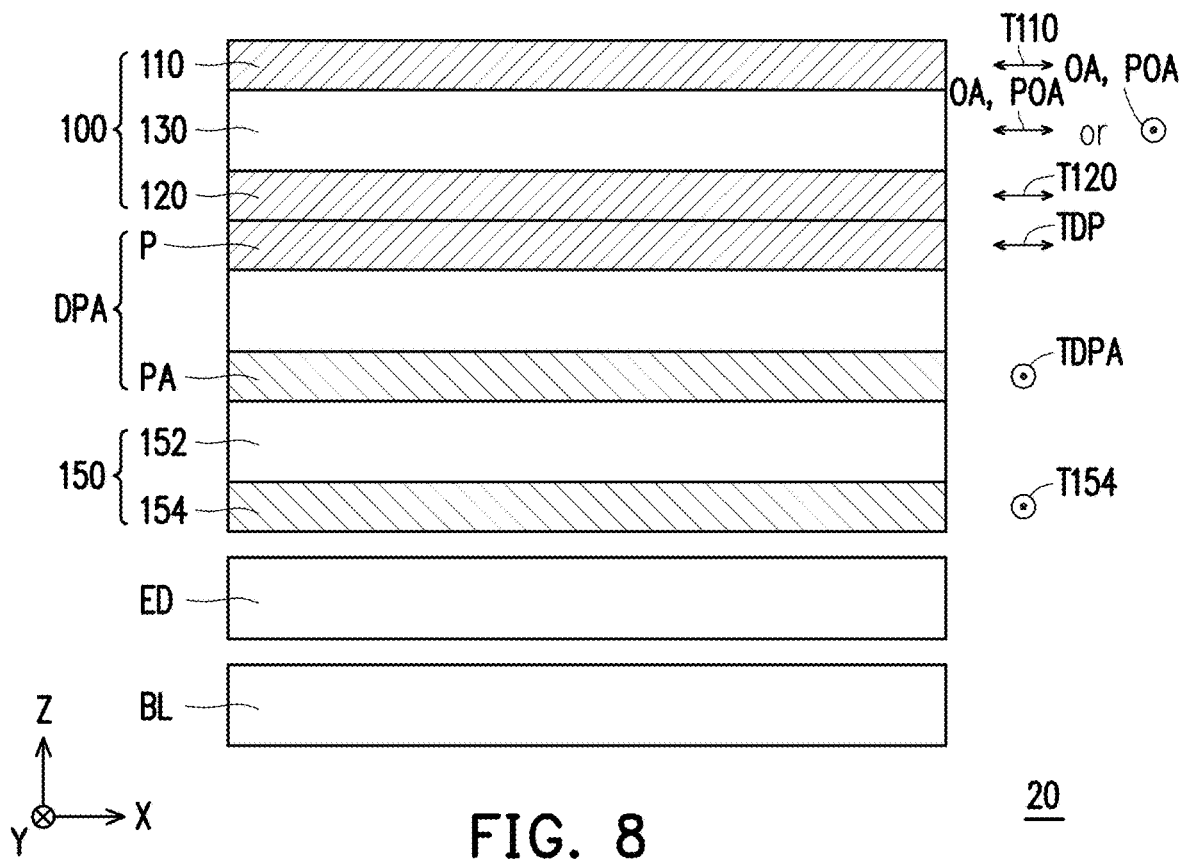
FIG. 8 and FIG. 9 are cross-sectional views schematically illustrating viewing angle switchable display modules according to a second embodiment and a third embodiment of the invention.
Figure 9:
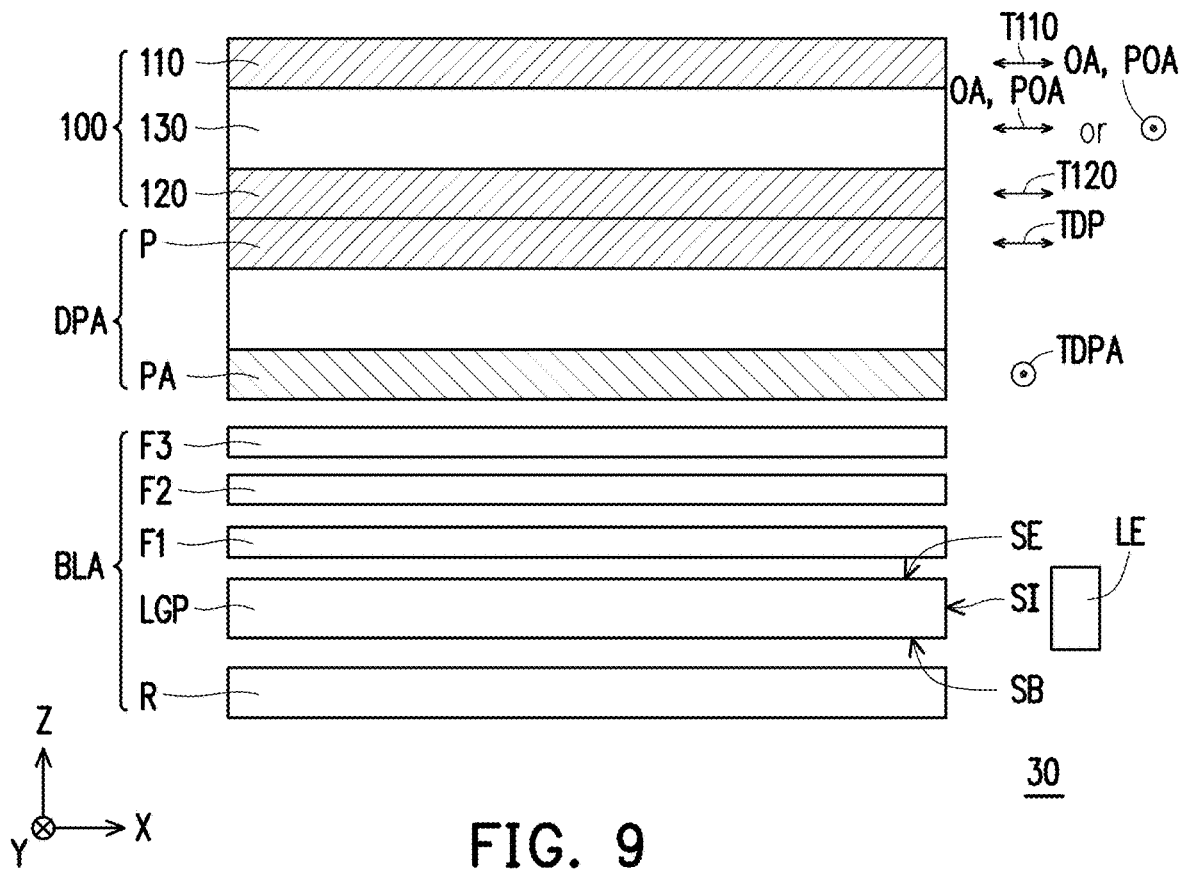

Other implementations of the viewing angle switchable display module 10 are described below with reference of FIG. 8 and FIG. 9, where the same components are denoted by the same referential numbers, and details thereof are not repeated. FIG. 8 and FIG. 9 are cross-sectional views schematically illustrating viewing angle switchable display modules according to a second embodiment and a third embodiment of the invention.

Referring to FIG. 8, main differences between the viewing angle switchable display module 20 of the second embodiment of the invention and the viewing angle switchable display module 10 of FIG. 6A are as follows. In the viewing angle switchable display module 10 of FIG. 6A, the display panel DP is a self-luminous display panel, such as an organic light-emitting display panel. In the viewing angle switchable display module 20, the display panel DP is a non-self-luminous display panel, such as an In-Plane-Switching (IPS) liquid crystal display panel, though the invention is not limited thereto. Moreover, the viewing angle switchable display module 20 further includes a collimation backlight module BL, an electrically controlled optical diffuser ED, and the compensation element 150 of FIG. 3.

The collimation backlight module BL may be implemented by any conventionally backlight module which may provide a collimated light beam. The electrically controlled optical diffuser ED may include two transparent substrates (not shown), two transparent conductive layers (not shown) disposed between the two transparent substrates and a Polymer-Dispersed Liquid Crystal (PDLC) (not shown) disposed between the two transparent conductive layers. When there is no potential difference between the two transparent conductive layers, the PDLC may be in a transparent state, and when there is a potential difference between the two transparent conductive layers, the PDLC may be in a scattering state. In the general display mode, the PDLC in the scattering state may provide a planar light source with a more uniform light intensity distribution. In the peep-avoiding mode, the PDLC in the transparent state may provide a collimated planar light source.

Besides the polarizer P, the display panel DPA further includes a polarizer PA, and the polarizer PA is located at a light incident side (a side of the display panel DPA facing the collimation backlight module BL) of the display panel DPA. In the embodiment, the display panel DPA is located between the viewing angle switchable device 100 and the compensation element 150. The transmission axis TDP of the polarizer P is perpendicular to a transmission axis TDPA of the polarizer PA. Moreover, the transmission axis TDP of the polarizer P, the transmission axis T120 of the reflective polarizer 120 and the transmission axis T110 of the absorptive polarizer 110 are parallel to each other, and the orthogonal projection POA of the optical axis OA of each of the liquid crystal molecules LCM in the viewing angle switchable device 100 on the absorptive polarizer 110 is parallel to or perpendicular to the transmission axis T110 of the absorptive polarizer 110, while the transmission axis TDPA of the polarizer PA is parallel to the transmission axis T154 of the absorptive polarizer 154 of the compensation element 150. However, the relative configuration relationships of the above components and the extending directions of the transmission axes may be changed as required, which are not limited to the implementation shown in FIG. 8.

For example, in another embodiment, the compensation element 150 may be located between the viewing angle switchable device 100 and the display panel DPA. In still another embodiment, the compensation element 150 may be omitted in the configuration of FIG. 8, and the compensation film 152 is disposed between the polarizer P and the reflective polarizer 120. In yet another embodiment, the compensation element 150 is omitted. In any of the aforementioned embodiments, the viewing angle switchable device 100 may be replaced by the viewing angle switchable device 200 of FIG. 2, the viewing angle switchable device 400 of FIG. 4A or the viewing angle switchable device 500 of FIG. 5.

Referring to FIG. 9, main differences between the viewing angle switchable display module 30 of the third embodiment of the invention and the viewing angle switchable display module 20 of FIG. 8 are as follows. The compensation element 150 and the electrically controlled optical diffuser ED of FIG. 8 are omitted from the viewing angle switchable display module 30. Moreover, the collimation backlight module BL is replaced by a backlight module BLA. The backlight module BLA includes at least one diffuser F1, a prism sheet F2 and a prism sheet F3. In the embodiment, the backlight module BLA may further include at least one light-emitting element LE, a light guide plate LGP and a reflector R. The light guide plate LGP has a light entering surface SI, a bottom surface SB and a light emitting surface SE, where the bottom surface SB and the light emitting surface SE are opposite to each other, and the light entering surface SI is connected to the bottom surface SB and the light emitting surface SE. The light-emitting element LE is disposed beside the light entering surface SI. The reflector R is located below the bottom surface SB. The diffuser F1, the prism sheet F2 and the prism sheet F3 are sequentially stacked on the light emitting surface SE.

In another embodiment, the backlight module BLA may further include another diffuser or a Dual Brightness Enhancement Film (DBEF), and this another diffuser (or the DBEF) may be disposed on the prism sheet F3. Moreover, the viewing angle switchable display module 20 may further include the compensation element 150 of FIG. 8, and the compensation element 150 may be disposed between the backlight module BLA and the display panel DPA or between the viewing angle switchable device 100 and the display panel DPA. In still another embodiment, the compensation film 152 may be configured between the polarizer P and the reflective polarizer 120. In any of the aforementioned embodiments, the viewing angle switchable device 100 may be replaced by the viewing angle switchable device 200 of FIG. 2, the viewing angle switchable device 300 of FIG. 3, the viewing angle switchable device 400 of FIG. 4A or the viewing angle switchable device 500 of FIG. 5.

In summary, the embodiments of the invention have at least one of the following advantages or effects. In the viewing angle switchable devices of the invention, an inclination direction of the liquid crystal molecules in the viewing angle switchable device is controlled by changing a potential difference between the two transparent conductive layers. In this way, a phase delay is caused in the light beam entering the viewing angle switchable device by a large angle, and this light beam thus cannot pass through the absorptive polarizer. Therefore, the range of the viewing angle is narrowed and a peep is substantially avoided. Moreover, by configuring at least one compensation film, the viewing angle switchable device may mitigate the large angle light leakage and enlarge a peep-avoiding range on azimuth. Furthermore, by configuring the reflective polarizer, the environmental light beam entering the viewing angle switchable device by a large angle is reflected by the reflective polarizer to enhance the reflection of the environmental light beam by the viewing angle switchable device. By enhancing the reflection of the environmental light beam, a contrast of large angle light leakage is decreased, so as to help avoid a peep from a large angle. A plurality of openings may be formed on the reflective polarizer to block the large angle light leakage, so as to further improve the peep-avoiding effect. The viewing angle switchable display module employing the viewing angle switchable device may be switched between the general display mode and the peep-avoiding mode in an electric control manner, and a backlight module may be optionally selected for the non-self-luminous display panel used with the viewing angle switchable display module.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A viewing angle switchable device, comprising:
   an absorptive polarizer;
   a reflective polarizer, disposed at a side of the absorptive polarizer, wherein a transmission axis of the reflective polarizer is parallel to a transmission axis of the absorptive polarizer;
   an electrically controlled viewing angle switching element, disposed between the absorptive polarizer and the reflective polarizer and comprising two conductive layers and a liquid crystal layer disposed between the two conductive layers; and
   a compensation film, disposed between the absorptive polarizer and the reflective polarizer and overlapped with the electrically controlled viewing angle switching element,
   wherein the liquid crystal layer comprises a plurality of liquid crystal molecules, and when there is a potential difference between the two conductive layers, an orthogonal projection of an optical axis of each of the plurality of liquid crystal molecules on the absorptive polarizer is parallel to or perpendicular to the transmission axis of the absorptive polarizer and the transmission axis of the reflective polarizer.

2. The viewing angle switchable device as claimed in claim 1, wherein the compensation film is an A-type plate, an O-type plate, a C-type plate or a composite plate constructed by at least two of the above three types of plates.

3. The viewing angle switchable device as claimed in claim 1, further comprising:
   a compensation element, disposed on a surface of the reflective polarizer away from the electrically controlled viewing angle switching element or disposed on a surface of the absorptive polarizer away from the electrically controlled viewing angle switching element, wherein the compensation element comprises a compensation film and an absorptive polarizer, wherein a transmission axis of the absorptive polarizer of the compensation element is parallel to the transmission axis of the absorptive polarizer and the transmission axis of the reflective polarizer, and wherein the absorptive polarizer of the compensation element is disposed on a surface of the compensation film of the compensation element away from the electrically controlled viewing angle switching element.

4. The viewing angle switchable device as claimed in claim 3, wherein the compensation film of the compensation element is an A-type plate, an O-type plate, a C-type plate or a composite plate constructed by at least two of the above three types of plates.

5. The viewing angle switchable device as claimed in claim 1, wherein the reflective polarizer has at least one opening, the at least one opening is configured with another absorptive polarizer, and a transmission axis of the another absorptive polarizer is parallel to the transmission axis of the absorptive polarizer and the transmission axis of the reflective polarizer.

6. The viewing angle switchable device as claimed in claim 1,
wherein the reflective polarizer has at least one opening, and the viewing angle switchable device further comprises another absorptive polarizer, and
wherein the reflective polarizer is disposed between the another absorptive polarizer and the electrically controlled viewing angle switching element, and a transmission axis of the another absorptive polarizer is parallel to the transmission axis of the absorptive polarizer and the transmission axis of the reflective polarizer.

7. The viewing angle switchable device as claimed in claim 1, wherein the electrically controlled viewing angle switching element further comprises two substrates, and the two conductive layers are disposed between the two substrates.

8. The viewing angle switchable device as claimed in claim 7, wherein the two substrates are transparent.

9. The viewing angle switchable device as claimed in claim 1, wherein at least one of the two conductive layers is transparent.

10. A viewing angle switchable display module, comprising:
a display panel; and
a viewing angle switchable device, disposed on a display surface of the display panel and comprising:
an absorptive polarizer;
a reflective polarizer, disposed at a side of the absorptive polarizer, wherein a transmission axis of the reflective polarizer is parallel to a transmission axis of the absorptive polarizer;
an electrically controlled viewing angle switching element, disposed between the absorptive polarizer and the reflective polarizer and comprising two conductive layers and a liquid crystal layer disposed between the two conductive layers; and
a compensation film, disposed between the absorptive polarizer and the reflective polarizer and overlapped with the electrically controlled viewing angle switching element, wherein the liquid crystal layer comprises a plurality of liquid crystal molecules, and when there is a potential difference between the two conductive layers, an orthogonal projection of an optical axis of each of the plurality of liquid crystal molecules on the absorptive polarizer is parallel to or perpendicular to the transmission axis of the absorptive polarizer and the transmission axis of the reflective polarizer.

11. The viewing angle switchable display module as claimed in claim 10, wherein the compensation film is an A-type plate, an O-type plate, a C-type plate or a composite plate constructed by at least two of the above three types of plates.

12. The viewing angle switchable display module as claimed in claim 10, further comprising:
a compensation element, overlapped with the display panel and the viewing angle switchable device,
wherein the compensation element comprises a compensation film and an absorptive polarizer, wherein a transmission axis of the absorptive polarizer of the compensation element is parallel to the transmission axis of the absorptive polarizer and the transmission axis of the reflective polarizer.

13. The viewing angle switchable display module as claimed in claim 12, wherein the compensation film of the compensation element is an A-type plate, an O-type plate, a C-type plate or a composite plate constructed by at least two of the above three types of plates.

14. The viewing angle switchable display module as claimed in claim 10, wherein the display panel is an organic light-emitting display panel.

15. The viewing angle switchable display module as claimed in claim 10, wherein the display panel is a liquid crystal display panel, and the viewing angle switchable display module further comprises a collimation backlight module and an electrically controlled optical diffuser disposed on a light emitting surface of the collimation backlight module.

16. The viewing angle switchable display module as claimed in claim 10, wherein the display panel is a liquid crystal display panel, and the viewing angle switchable display module further comprises:
a backlight module, wherein the backlight module comprises at least one diffuser and two prism sheets.

17. The viewing angle switchable display module as claimed in claim 10, wherein the reflective polarizer has at least one opening, the at least one opening is configured with another absorptive polarizer, and a transmission axis of the another absorptive polarizer is parallel to the transmission axis of the absorptive polarizer and the transmission axis of the reflective polarizer.

18. The viewing angle switchable display module as claimed in claim 10,
wherein the reflective polarizer has at least one opening, and the viewing angle switchable device further comprises another absorptive polarizer, and
wherein the reflective polarizer is disposed between the another absorptive polarizer and the electrically controlled viewing angle switching element, and a transmission axis of the another absorptive polarizer is parallel to the transmission axis of the absorptive polarizer and the transmission axis of the reflective polarizer.

19. The viewing angle switchable display module as claimed in claim 10, wherein the electrically controlled viewing angle switching element further comprises two substrates, and the two conductive layers are disposed between the two substrates.

20. The viewing angle switchable display module as claimed in claim 19, wherein the two substrates are transparent.

21. The viewing angle switchable display module as claimed in claim 10, wherein at least one of the two conductive layers is transparent.

* * * * *